United States Patent
Washino et al.

(10) Patent No.: US 6,923,379 B2
(45) Date of Patent: Aug. 2, 2005

(54) CARD CONNECTING ADAPTER AND IC CARD WITH ANTENNA

(75) Inventors: Kiyoshi Washino, Yokohama (JP); Akihiro Tochi, Yokohama (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 53 days.

(21) Appl. No.: 10/352,121

(22) Filed: Jan. 28, 2003

(65) Prior Publication Data

US 2003/0111541 A1 Jun. 19, 2003

Related U.S. Application Data

(62) Division of application No. 09/767,734, filed on Jan. 24, 2001, now Pat. No. 6,574,112.

(30) Foreign Application Priority Data

Jan. 24, 2000 (JP) ...................................... P2000-014980

(51) Int. Cl.[7] .............................................. G06K 19/06
(52) U.S. Cl. ...................................... 235/492; 343/702
(58) Field of Search ................................ 235/492, 487; 343/702; 439/344

(56) References Cited

U.S. PATENT DOCUMENTS

| | | | |
|---|---|---|---|
| 5,563,400 A | | 10/1996 | Le Roux |
| 5,689,821 A | * | 11/1997 | Shimazaki .................. 708/109 |
| 5,752,857 A | | 5/1998 | Knights |
| 5,773,332 A | * | 6/1998 | Glad ........................... 439/344 |
| 5,846,092 A | | 12/1998 | Feldman et al. ........... 439/76.1 |
| 5,864,463 A | * | 1/1999 | Tsukada et al. ............. 361/686 |
| 5,946,194 A | * | 8/1999 | Dudas et al. ................ 361/737 |
| 6,107,971 A | * | 8/2000 | Flegeo ....................... 343/702 |
| 6,122,175 A | | 9/2000 | Shieh ......................... 361/737 |
| 6,139,338 A | | 10/2000 | Hirai et al. ................. 439/141 |
| 6,574,112 B2 | * | 6/2003 | Washino et al. ............ 361/752 |
| 6,812,897 B2 | * | 11/2004 | Jarmuszewski et al. ..... 343/702 |

FOREIGN PATENT DOCUMENTS

| | | |
|---|---|---|
| EP | 0 939 582 | 9/1999 |
| KR | 1995-7003776 | 12/1995 |
| TW | 83208139 | 10/2002 |
| WO | WO 98/37512 | 8/1998 |

\* cited by examiner

*Primary Examiner*—Michael G. Lee
*Assistant Examiner*—Jamara A. Franklin
(74) *Attorney, Agent, or Firm*—Oblon, Spivak, McClelland, Maier & Neustadt, P.C.

(57) ABSTRACT

A CF card can be shifted in position with respect to a card connecting adapter between a position where it is projected from the housing of the card connecting adapter and a position where it is prevented from projecting from the housing of the card connecting adapter. When the CF card is set at the position where it is prevented from projecting from the housing of the card connecting adapter, the antenna mounting surface of the CF card with an antenna is prevented from projecting from the body of a notebook personal computer. On the other hand, when the CF card is set at the position where it is projected from the housing, the antenna mounting surface is projected from the PC card slot.

2 Claims, 13 Drawing Sheets

CARD CONNECTING ADAPTER AND IC CARD WITH ANTENNA

CROSS-REFERENCE TO RELATED APPLICATION

This application is a Division of application Ser. No. 09/767,734 filed on Jan. 24, 2001 now U.S. Pat. No. 6,574,112. The present application claims priority under 35 U.S.C. §119 to Japanese Patent Application No. 2000-014980, filed Jan. 24, 2000, and under 35 U.S.C. §120 to co-pending U.S. patent application Ser. No. 09/767,734 filed Jan. 24, 2001, the entire contents of which are incorporated herein by reference.

BACKGROUND OF THE INVENTION

1. Field of the Invention

The present invention relates to an adapter for connecting an IC card for a certain standard such as a CF (compact flash) card to a differently-standardized card slot such as a PC card slot. In particular, to an improved adapter which is advantageous in connecting an IC card with an antenna to a card slot for a different standard. Also, the present invention relates to an IC card with an antenna.

2. Description of the Related Art

Data transfer between two or more pieces of information equipment represented by a desktop personal computer or a notebook personal computer and a PDA (Personal Digital Assistant), conventionally, has been carried out through a cable data transmission system using a connecting cable. However, in the cable data transmission system, it takes time and labor to connect the cable and, in the data transmission, there is a limit on an arrangement of the information equipment. Therefore, recently, a wireless data transmission system has been proposed for mutual data transmission between plural pieces of the information equipment.

A typical method for realizing such wireless data transmission is to mount a PC card into a PC card slot of, for example, a notebook personal computer. In the case of the portable equipment such as a PDA, mostly, there is provided a CF card slot corresponding to a CF card which is smaller in size than the PC card. In this case, a CF card with an antenna may be used.

In the case of a user who owns both of the notebook computer and portable equipment, the user may use an adapter which can adapt the CF card to the PC card slot, so that the user can use the CF card with antenna in both of the notebook computer and portable equipment.

In the case of the CF card with an antenna, a long antenna is mounted on the CF card rear end face which, in a state where the CF card with an antenna is mounted into a CF card slot, faces outward of this CF card slot. Due to this structure, the antenna can be exposed from the CF card slot to thereby be able to secure a good communication condition.

However, when mounting the CF card with an antenna into the PC card slot using the adapter, in some cases, a good communication condition cannot be secured. This results mainly from the structure of the PC card slot of the notebook personal computer.

That is, the PC card slot of the notebook personal computer is generally structured such that the rear end face of the PC card is exposed from its body; however, depending on the type of the notebook personal computer, there is also employed a structure in which the rear end face of the PC card is stored in the PC card slot. In this case, the antenna of the CF card with an antenna cannot be sufficiently exposed from the body of the notebook personal computer, so that a good communication condition cannot be secured.

In view of the above, it may be expected to change the structure of the adapter in such a manner that the rear end face of the CF card with an antenna can be exposed regardless of the structure of the PC card slot. However, in this case, the adapter with the CF card with an antenna mounted thereon, as a whole, has a structure which does not comply with the standard of the PC card. Also, in the case of a notebook personal computer having a PC card slot which is structured so as to permit the exposure of the rear end face of a CF card, the rear end portion of the CF card is always projected from the body of the notebook personal computer. Therefore, this structure raises the following problems: that is, this structure degrades the appearance of the notebook personal computer, is inconvenient to store and carry the notebook personal computer, and is easy to receive shocks from the periphery to be thereby damaged easily.

Further, in the case of a PC card with an antenna structured such that an antenna is mounted on the rear end face thereof, there exist similar problems to the above.

SUMMARY OF THE INVENTION

The present invention aims at solving the above-mentioned problems found in the conventional card connecting adapter. Accordingly, it is an object of the invention to provide a card connecting adapter which is capable of exposing a portion of an IC card outwardly of a card slot as the need arises.

Also, it is another object of the invention to provide an IC card with an antenna which is capable of exposing an antenna outwardly of a card slot to thereby be able to secure a good communication condition while solving the above-mentioned problems found in the conventional IC card with an antenna.

In attaining the first object, according to a first aspect of the invention, there is provided a card connecting adapter (1) for mounting, into a card slot (201) meeting a first standard, an IC card (100) meeting a second standard different from the first standard, the card connecting adapter (1) including: a card-shaped housing (2) corresponding to the first standard; a first connecting portion (3) for sending and receiving a signal between the card slot between itself in accordance with the first standard; a second connecting portion (4) for sending and receiving a signal between an IC card meeting the second standard and itself in accordance with the second standard; a card holding member (6) not only capable of holding an IC card meeting the second standard, but also shiftably held on the housing in such a manner that it can be shifted between a first position where a portion of an IC card held thereby is projected outwardly of the housing and a second position where a portion of the IC card is retreated from the first position toward the interior portion of the housing; and, a connecting mechanism (5) for electrically connecting the IC card held by the card holding member to the first connecting portion through the second connecting portion. The alphanumeric characters within the parentheses designate their respective corresponding components which are included in the embodiments of the invention to be discussed hereinafter. This applies similarly in the following descriptions as well.

According to the first aspect of the invention, by shifting the card holding member between the first and second positions with respect to the housing, a portion of the IC card mounted can be projected and retreated. Therefore, in the card slot of arbitrary information equipment to which the present card connecting adapter is applied, the first position may be set in such a manner that the above-mentioned portion of the IC card held by the card holding member can be made to project outwardly of the present card slot. Due to this, a portion of the IC card can be set at a position where the present portion of the IC card can be projected outwardly of the card slot according to cases. Of course, when the portion of the IC card can be projected outwardly of the card slot even when the card holding member is set at the second position, the IC card may also be used while the card holding member remains set at the second position.

For example, as the IC card, there may be used an IC card with an antenna. In this case, the above-mentioned portion of the IC card, preferably, may be the antenna mounting portion (100b). Due to this, the antenna can be projected outwardly of the card slot regardless of the structure of the card slot. In the case of a card slot which is structured such that the whole IC card with an antenna can be embedded therein, when the IC card with an antenna is in use, with the card holding member set at the first position, the antenna can be projected outwardly of the card slot; and, when not in use, with the card holding member set at the second position, the IC card with an antenna can be held in such a manner that it is stored into the card slot.

The card holding member, preferably, may be mounted on the housing in such a manner that it can be slidingly shifted in a direction along any one of the four sides of the IC card. However, this is not limitative but, for example, the card holding member may also be mounted on the housing in such a manner that it can be rotated with respect to the housing.

The card holding member, as set forth in a second aspect of the invention, may also be a card holding member which includes a header holding the above-mentioned second connecting portion.

In this structure, for example, when the second connecting portion and IC card are contact connected to each other by means of the fitting engagement of their respective connecting pins, due to the mutual connection between the second connecting portion and IC card, the IC card can be held by the card holding member.

According to a third aspect of the invention, in a card connecting adapter as set forth in the first or second aspect of the invention, the connecting mechanism includes a flexible printed wiring cable (53) for connecting the first and second connecting portions to each other.

According to this structure, even if the distance between the first and second connecting portions is varied as the card holding member is shifted, such variations in the distance can be absorbed by the deformation of the flexible printed wiring cable. This makes it possible to secure a good connecting condition between the first and second connecting portions.

As the connecting mechanism for electrically connecting the first and second connecting portions to each other, there can be employed a structure in which a first terminal (group) connected to the first connecting portion and a second terminal (group) connected to the second connecting portion can be slid together as the card holding member is shifted.

In case that there is little need for the first and second connecting portions to be always connected to each other, there may also be employed a structure in which the first and second connecting portions can be electrically connected to each other only when the card holding member is set at the first or second position.

The second connecting portion need not always be shifted together with the card holding member. For example, the terminal (group) of the IC card to be shifted together with the card holding member and the terminal (group) of the second connecting portion fixed to the housing may be slid as the card holding member is shifted.

According to a fourth aspect of the invention, in a card connecting adapter as set forth in any one of the first to third aspects of the invention, there is further included a lock mechanism (9, 60) which, when at least the card holding member is set at the second position, can prevent the card holding member from shifting.

This structure can maintain a state in which the IC card is not projected from the card slot. That is, the second position of the card holding member, preferably, may be set in such a manner that the above-mentioned portion of the IC card held by the card holding member is prevented from projecting from the card slot and, more preferably, may be set in such a manner that the above-mentioned portion of the IC card is prevented from projecting from the housing.

According to a fifth aspect of the invention, in a card connecting adapter as set forth in the fourth aspect of the invention, there is further included a spring member (8) for elastically energizing the card holding member toward the first position.

With use of this structure, by removing the locked state of the card holding member at the second position, the card holding member can be guided to the first position easily.

According to a sixth aspect of the invention, in a card connecting adapter as set forth in the fourth or fifth aspect of the invention, the lock mechanism can apply an external force going toward the second position to an IC card held by the card holding member to thereby be able to restrict the shifting motion of the card holding member at the second position and thus lock the card holding member at the second position, and also the lock mechanism can apply an external force going toward the second position from the first position to an IC card held by the card holding member set at the second position to thereby be able to remove the locked state of the card holding member.

According to the sixth aspect of the invention, by applying an external force, which goes from the first position toward the second position, to an IC card held by the card holding member, the card holding member can be easily shifted between the first and second positions.

Further, according to a seventh aspect of the invention, there is provided an IC card with an antenna, including: a card-shaped housing; a connecting portion to be mounted onto the housing and connected into a card slot; and, an antenna hold member not only capable of holding an antenna but also shiftably mounted on the housing in such a manner that an antenna held by the antenna hold member can be shifted between a first position where it is projected outwardly of the housing and a second position where it is retreated form the first position toward the interior portion of the housing.

According to the seventh aspect of the invention, since the antenna hold member holding an antenna can be shifted with respect to the housing, as the need arises, the antenna can be set at a position where the antenna is projected from the housing. Owing to this, in the card slot of arbitrary information equipment to which the present IC card with an antenna is applied, the first position may be set in such a manner that the antenna can be made to project outwardly of the present card slot. Due to this, the antenna can be set at a position where the antenna can be projected outwardly of the card slot according to cases. Of course, in case where the antenna can be projected outwardly of the card slot even when the antenna hold member is set at the second position, the IC card may also be used while the antenna hold member remains set at the second position.

The antenna hold member, preferably, may be mounted on the housing in such a manner that it can be slidingly shifted in a direction along any one of the four sides of the IC card. However, this is not limitative but, for example, the antenna hold member may also be mounted on the housing in such a manner that it can be rotated with respect to the housing.

BRIEF DESCRIPTION OF THE DRAWINGS

FIG. 5(a) is a bottom view thereof; FIG. 5(b) is a view thereof, when it is viewed from the direction of an arrow J shown in FIG. 5(a); and, FIG. 5(c) is a side view thereof, when it is viewed from the direction of an arrow K shown in FIG. 5(a);

FIG. 6(a) is a bottom view thereof; FIG. 6(b) is a view thereof, when it is viewed from the direction of an arrow L shown in FIG. 6(a); FIG. 6(c) is a section view thereof, taken along the line II—II shown in FIG. 6(a); and, FIG. 6(d) is a view thereof when it is viewed from the direction of an arrow M shown in FIG. 6(a);

FIG. 7(a) is an enlarged view thereof; FIG. 7(b) is a section view thereof, taken along the line III—III shown in FIG. 7(a); FIG. 7(c) is a section view thereof, taken along the line IV—IV shown in FIG. 7(a); and, FIG. 7(d) is a section view thereof, taken along the line V—V shown in FIG. 7(a);

FIG. 8(a) shows a state in which the header is present at a first position; and, FIG. 8(b) shows a state in which the header is present at a second position;

DETAILED DESCRIPTION OF THE PREFERRED EMBODIMENTS

Now, description will be given below in detail of embodiments of the invention with reference to the accompanying drawings.

Figure 1:
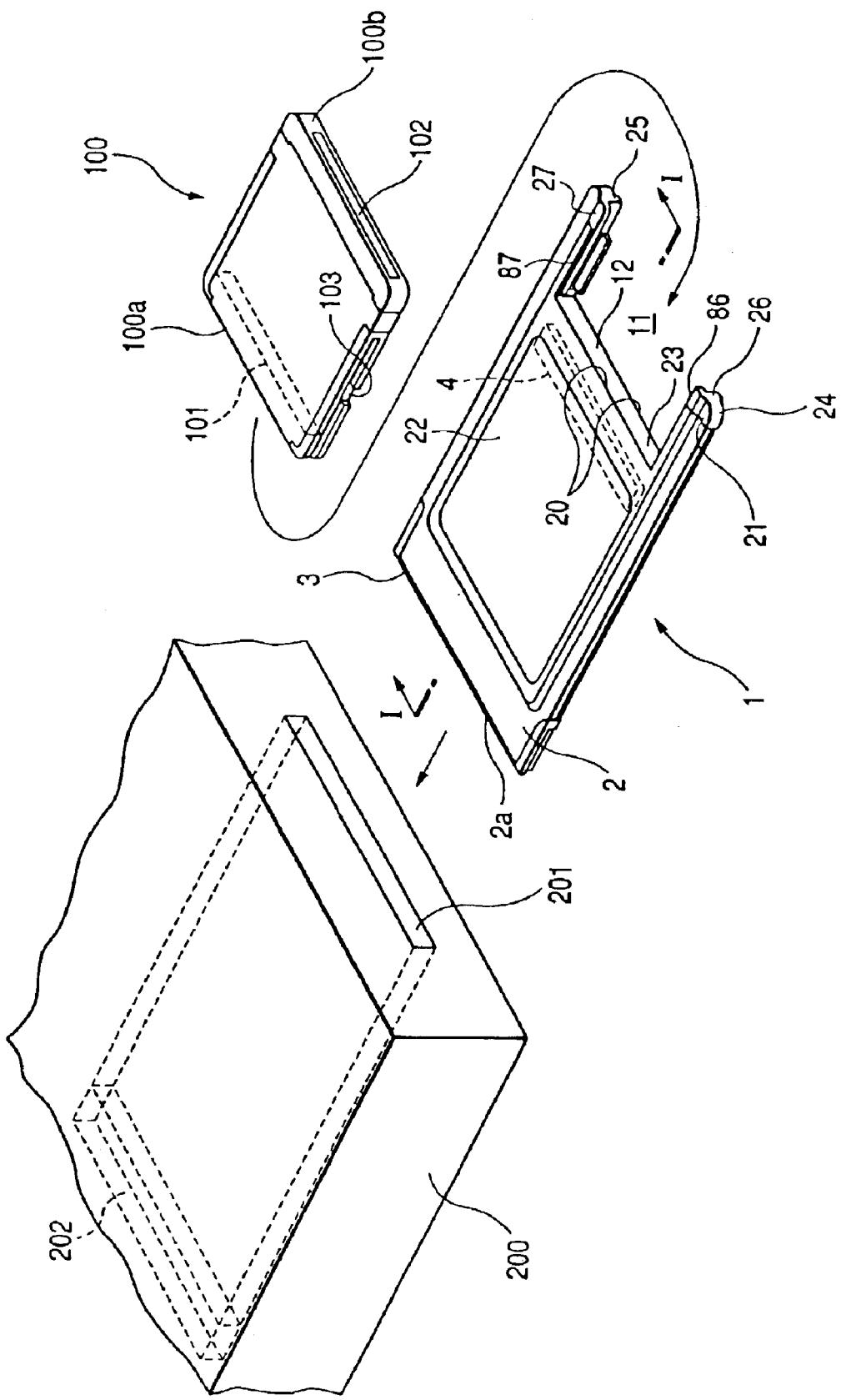
FIG. 1 is a perspective view of the structure of a card connecting adapter according to a first embodiment of the invention.
Figure 2:
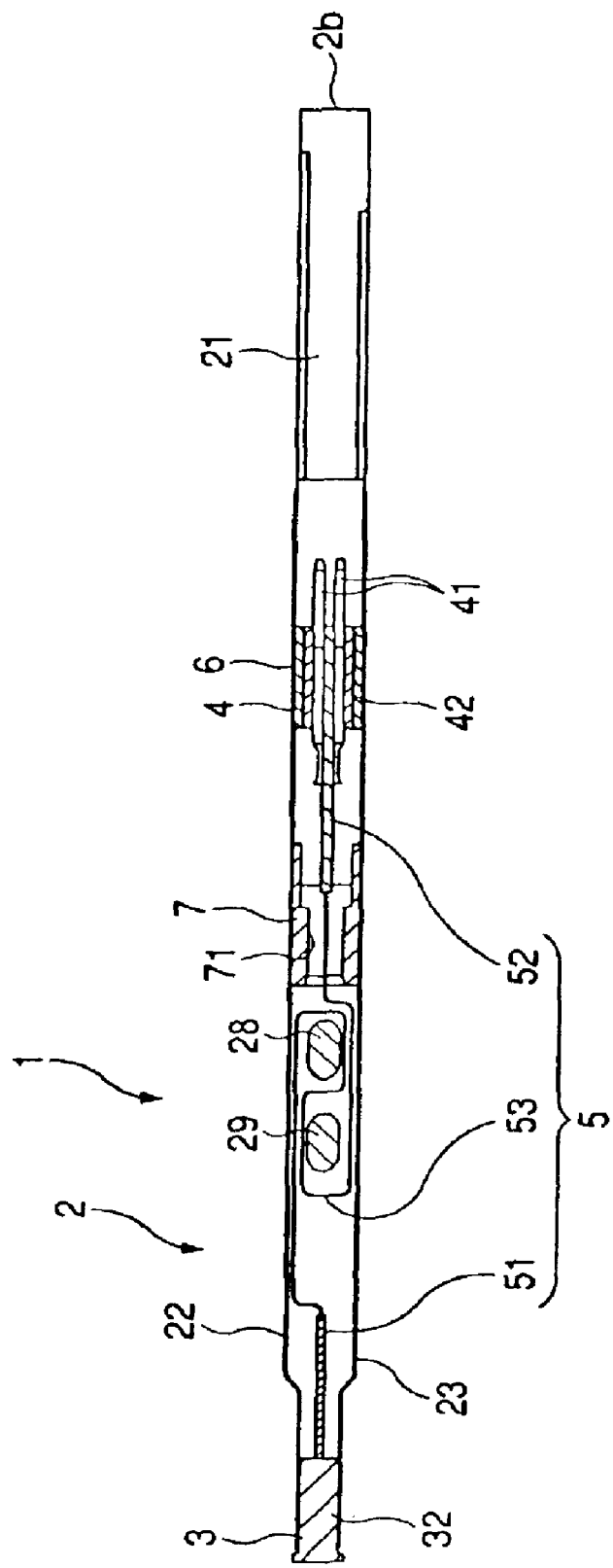
FIG. 2 is a section view of the above card connecting adapter, taken along the line I—I shown in FIG. 1.

Specifically, FIG. 1 is a perspective view of a first embodiment of a card connecting adapter according to the invention, showing the outer appearance thereof. FIG. 2 is a section view of the above card connecting adapter, taken along the line I—I shown in FIG. 1.

This card connecting adapter 1 has an outer shape equivalent to a card for a first standard (that is, a PC card of Type II for a first standard), and also includes a card mounting space 11 for mounting a card for a second standard (that is, a CF card of Type I for a second standard). When a CF card 100 (a CF card with an antenna) is mounted into the card mounting space 11, the card connecting adapter 1 with the CF card 100 mounted thereon provides the same form as the PC card of Type II as a whole.

The card connecting adapter 1 with the CF card 100 mounted thereon is mounted into a PC card slot 201 (Type II) formed in a notebook personal computer 200, which is an example of information equipment, before it is actually used. The card connecting adapter 1 is structured so as to be able to hold the CF card 100 in such a manner that the CF card 100 can be shifted along the inserting direction thereof into the PC card slot 201 while maintaining the connected or mounted state of the CF card 100.

Figure 3A:
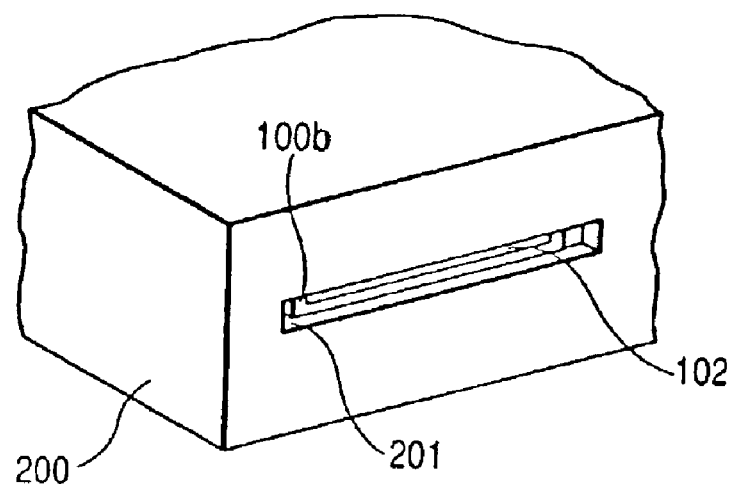
FIGS. 3(a) and 3(b) are perspective views of a card connecting adapter to which a CF card with an antenna is connected, showing a state in which the card connecting adapter is mounted into a PC card slot.
Figure 3B:
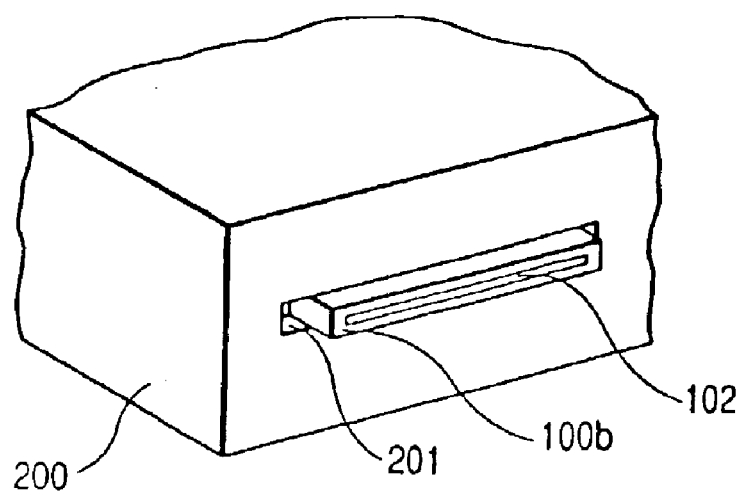

FIGS. 3(a) and 3(b) are perspective views of the card connecting adapter 1 with the CF card 100 connected thereto, showing a state in which it is mounted into the PC card slot 201. As the notebook personal computer, there is also known a computer which is structured such that the length dimension (depth) of a PC card slot thereof is set longer than the standardized dimension for a PC card; and, FIGS. 3(a) and 3(b) show a PC card slot 201 which belongs to such a computer.

The CF card 100 can be shifted with respect to the card connecting adapter 1 between a position, at which the CF card 100 is projected from the housing of the card connecting adapter 1, and a position at which it is prevented from projecting from the housing of the card connecting adapter 1.

In case where the CF card 100 is set at the position where it is prevented from projecting from the housing of the card connecting adapter 1, as shown in FIG. 3(a), the antenna mounting surface 100b (the rear end face on which an antenna 102 is mounted) of the CF card 100 with an antenna slips into the interior portion of the PC card slot 201 and does not projects from the body of the notebook personal computer 200. In this state, there cannot be expected a good communication condition.

On the other hand, when the CF card 100 is set at the position where it projects from the housing of the card connecting adapter 1, the antenna mounting surface 100b, as shown in FIG. 3(b), projects from the PC card slot 201 (in fact, however, it is not always necessary that the antenna mounting surface 100b projects in this manner, but it may only be exposed outwardly of the PC card slot 201 to such a degree that can secure a good communication condition). Due to this, the antenna 102 can provide a good communication condition.

Therefore, when communication through the antenna 102 is necessary, the antenna mounting surface 100b of the CF card 100 can be projected from the PC card slot 201 (see FIG. 3(b)); and, when the antenna 102 is not in use, the whole of the CF card 100 can be stored into the PC card slot 201. Therefore, not only radio communication using the antenna 102 can be carried out in a good condition, but also there is no fear that the adapter 1 itself can depart from the PC standards. Also, when not in use, the whole of the CF card 100 can be stored into the card slot 201; therefore, no inconvenience can arise when the adapter 1 is carried or stored, nor the adapter 1 can be damaged due to interference with articles disposed in the periphery thereof.

Now, description will be given below of the details of the structure of the card connecting adapter 1 with further reference to FIGS. 1 and 2.

The card connecting adapter 1 includes a housing 2 having a rectangular-card type outer shape which is defined by a frame 21 formed of resin and first and second metal covers 22, 23 respectively covering the upper and lower surfaces of the frame 21 (that is, the upper and lower surfaces in the state thereof shown in FIG. 1). On one end face 2a (front end face) of the housing 2 in the longitudinal direction thereof, there is disposed a first connector (first connecting portion) 3 which is to be mounted into a connector 202 disposed in the PC card slot 201 of the notebook personal computer 200 and is to be connected to the connector 202 with keeping contact.

The metal covers 22 and 23 are respectively structured such that their plane shapes are substantially rectangular and, on the opposite side of the metal covers 22 and 23 to the first connector 3, there are formed rectangular cut-out portions 20 which correspond to the CF card 100. Also, the frame 21 includes a pair of side rods 26 and 27 which are formed so as to extend in parallel to each other and, the portions of the side rods 26 and 27 that correspond to the cut-out portions 20 are respectively formed as a pair of parallel arm portions 24 and 25 which are used to guide the insertion and removal of the CF card 100 as well as hold the CF card 100. Between the pair of arm portions 24 and 25, there is formed the card mounting space 11 which is open in the inserting and removing direction of the CF card 100.

In the respective inner surfaces of the two arm portions 24 and 25, there are formed groove-shaped guides 86 and 87. The CF card 100 with an antenna is guided and slid along the guides 86 and 87 from the opposite side (that is, from the rear side) of the first connector 3 and is mounted into the card mounting space 11. In the following description, the inserting direction of the CF card 100 with an antenna into the card mounting space 11 is defined as a forward direction.

The CF card 100 with an antenna is a card, the plane shape of which is substantially rectangular; and, the dimensions of the CF card 100 meet the CF card standards. Specifically, the long side thereof is 42.8 mm, the short side is 36.4 mm, and the thickness is 3.3 mm. On the front end face 100a of the CF card 100, there is disposed a connector 101. Also, the rear end face of the CF card 100 provides the antenna mounting surface 100b with the long antenna 102 mounted thereon.

In the card connecting adapter 1, more specifically, in the deep portion of the card mounting space 11, there is disposed a second connector (second connecting portion) 4 which can be electrically connected to the connector 101 of the CF card 100. Due to such electric connection between the two connectors 101 and 4, that is, due to fitting engagement between the connecting pins 41 (see FIG. 2) of the second connector 4 and the connecting pins of the connector 101, the CF card 100 and card connecting adapter 1 can be connected to each other mechanically and electrically. In such connected state, the antenna mounting surface 100b of the CF card 100 with an antenna is exposed outwardly of the housing 2.

When the card connecting adapter 1 with the CF card 100 connected thereto is mounted into the PC card slot 201, the CF card 100 is connected to the PC card slot 201 mechanically and electrically through the card connecting adapter 1. In such connected state, the notebook personal computer 200 is able to execute radio data communication through the antenna 102 with respect to another notebook personal computer or portable information equipment.

Within the housing 2, the second connector 4 is held by a header 6. The header 6 is mounted on the housing 2 in such a manner that it can be freely slid between a first position and a second position shifted forwardly of the first position. When the header 6 is set at the first position, the antenna mounting surface 100b of the CF card 100 with an antenna, which is connected to the second connector 4, projects outwardly of the housing (see FIG. 3(b)). On the other hand, when the header 6 is set at the second position, the antenna mounting surface 100b of the CF card 100 with an antenna, which is connected with the second connector 4, is set at a position where it is prevented from projecting from the rear end 2b of the housing 2. For example, it is superimposed on the rear end 2b of the housing 2 (see FIG. 3(a)). That is, when the header 6 is set at the second position, the header 6 is set in a state where it is retreated from the first position toward the interior portion of the housing 2.

Figure 4A:
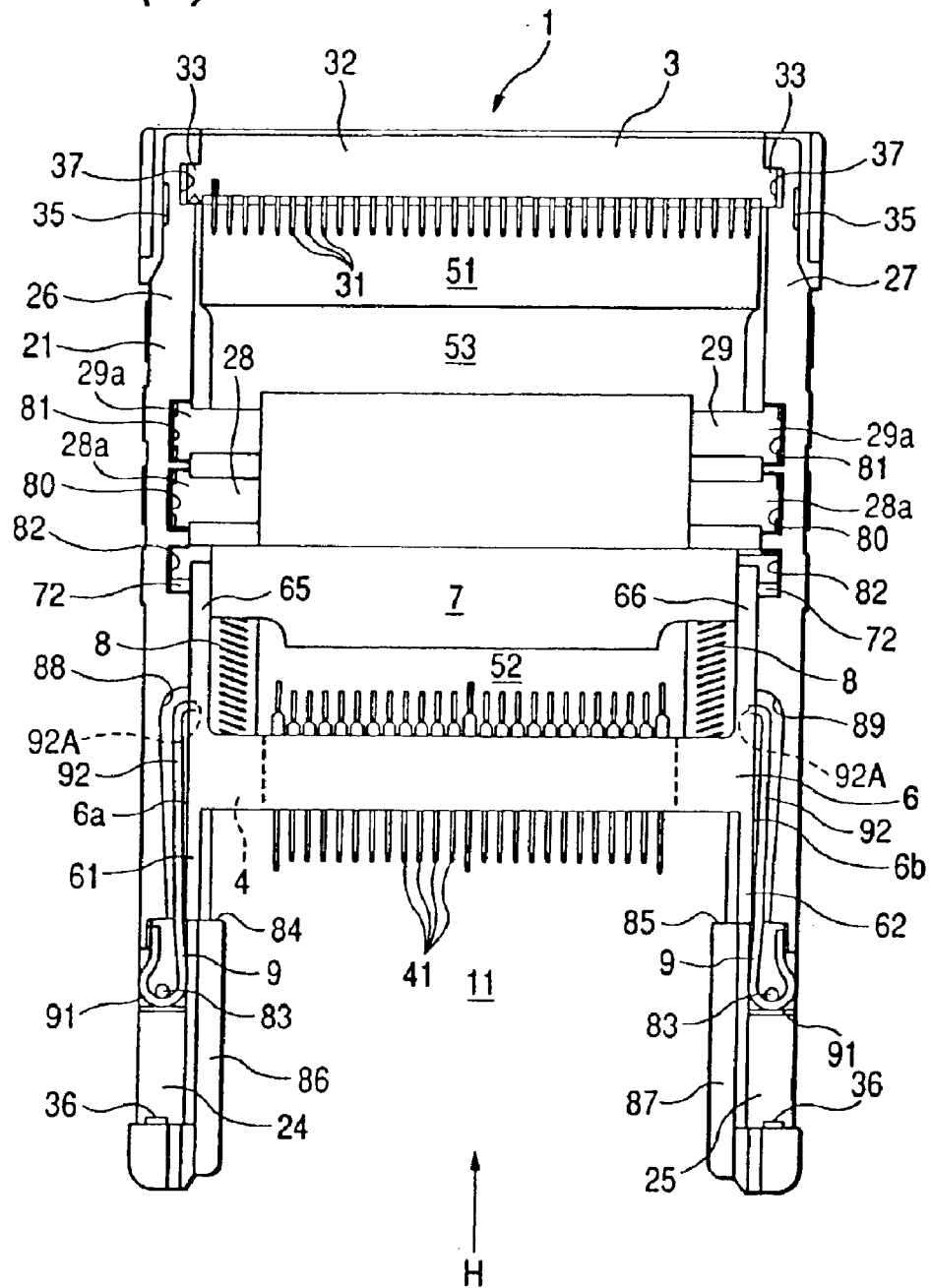
FIG. 4(a) is a bottom view of the internal structure of the card connecting adapter; and, FIG. 4(b) is a view thereof, when it is viewed from the direction of an arrow H shown in FIG. 4(a)
Figure 4B:
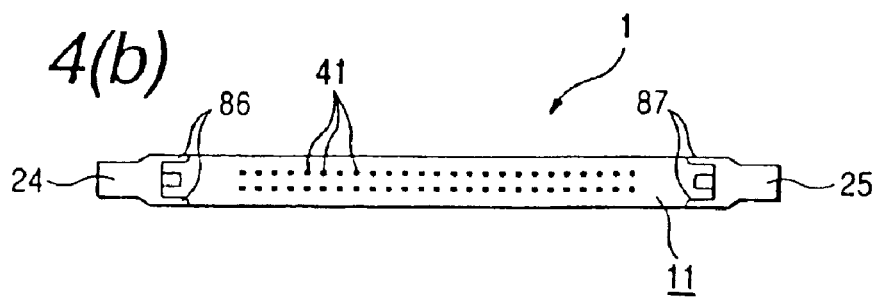

The first connector 3 includes a plurality of connecting pins 31 (see FIGS. 4(a) and 4(b)) which can be engaged with connecting pins disposed in the connector 202 of the PC card slot 201, and a main body portion 32 for holding these connecting pins 31 side by side in a parallel manner.

The second connector 4 includes a plurality of connecting pins 41 which can be engaged with a plurality of connecting pins (not shown) disposed in the connector 101 of the CF card 100 with an antenna, and a main body portion 42 for holding these connecting pins 41 side by side in a parallel manner.

The first and second connectors 3 and 4 are electrically connected to each other through a wiring body 5. Specifically, the wiring body 5 includes a first printed-circuit board 51 with a wiring pattern formed thereon, a second printed-circuit board 52 with a wiring pattern formed thereon, and a flexible printed wiring cable 53 for electrically connecting the first and second printed-circuit boards 51 and 52 to each other. The plurality of connecting pins 31 (see FIG. 4(a)), which are disposed in parallel in the first connector 3, are respectively connected to the wiring pattern formed on the first printed-circuit board 51, whereas the plurality of connecting pins 41 disposed in parallel in the second connector 4 are respectively connected to the wiring pattern formed on the second printed-circuit board 52. Due to such connection, the connecting pins 31 and 41 are connected to each other in such a manner that the arrangements of the pins are changed between the CF and PC card standards.

Between the header 6 and first connector 3, there is interposed a support member 7 which is used to support the header 6 in a freely slidable manner. This support member 7 is fixed to the frame 21. In the support member 7, there is formed a through hole 71 which penetrates through the support member 7 along the longitudinal direction thereof; and, into this through hole 71, there is inserted the wiring body 5 (flexible printed wiring cable 53). Owing to this structure, the wiring body 5 and support member 7 can be disposed efficiently in a limited space within the housing 2.

The flexible printed wiring cable 53 extends from the second printed-circuit board 52 through the through hole 71 of the support member 7 up to a portion between the metal cover 22 and two connecting rods 28, 29 (which will be discussed later), is turned back rearwardly in such a manner as to embrace the connecting rod 29, passes through between the two connecting rods 28 and 29, is further turned back forwardly in such a manner as to embrace the connecting rod 28, and is finally connected to the first printed-circuit board 51.

As the header 6 is shifted, the second connector 4 is slid in a direction to move toward and apart from the first connector 3. At the this time, the flexible printed wiring cable 53, mainly, a portion thereof existing between the connecting rods 28, 29 and first printed-circuit board 51 is shifted, so that variations in the distance between the first and second printed-circuit board 51 and 52 can be absorbed. Owing to this, the sliding shift of the header 6 is allowed while the electric connection between the first and second connectors 3 and 4 is maintained.

FIG. 4(a) is a bottom view of the card connecting adapter 1, showing the internal structure thereof, while FIG. 4(b) is a view of the card connecting adapter 1, when it is viewed from the direction of an arrow H shown in FIG. 4(a). In FIGS. 4(a) and (b), there is shown the structure of the card connecting adapter 1, with the first and second metal covers 22 and 23 removed therefrom.

The frame 21 includes a pair of parallel arranged side rods 26, 27 and the two connecting rods 28, 29 for connecting these side rods 26, 27 to each other. In the respective lower surfaces of the side rods 26 and 27, specifically, slightly forwardly of the central portions thereof, there are formed first and second mounting recesses 80 and 81 side by side. The first and second mounting recesses 80 and 81 are respectively opened toward the inside of the card connecting adapter 1. On the respective two ends of the pair of connecting rods 28 and 29, there are provided pressure-inserting projections 28a and 29a. The pressure-inserting projections 28a and 29a are respectively pressure inserted into the first and second mounting recesses 80 and 81 of the side rods 26 and 27; then, the pair of connecting rods 28 and 29 can be mounted onto the side rods 26, 27 respectively.

Also, in the respective upper and lower surfaces of the side rods 26 and 27, there are formed first and second pressure-inserting grooves 35 and 36 (in FIG. 4(a), there are shown only the first and second pressure-inserting grooves 35 and 36 that are formed in the lower surfaces of the side rods 26 and 27.); and, the pressure-inserting pieces (not shown) of the first and second metal covers 22 and 23 can be pressure inserted into the first and second pressure-inserting grooves 35 and 36, respectively.

In the vicinity of the front ends of the lower surfaces of the side rods 26 and 27, there are formed third mounting recesses 37 respectively. These third mounting recesses 37 are opened toward the inside of the card connecting adapter 1; and also, a pair of engagement projections 33, which are provided on the two end portions of the main body portion 32 of the first connector 3, can be mounted into these third mounting recesses 27.

Further, on the mutually opposing surfaces of the neighboring portions of the central portions of the side rods 26 and 27, there are provided mounting stepped portions 82 in such a manner that they adjoin the second mounting recesses 81 respectively; and, engagement projections 72 provided on the two ends of the support member 7 can be engaged with these mounting stepped portions 82, respectively.

On the intermediate portions of the arm portions 24 and 25 which provide the rear portions of the side rods 26 and 27, there are provided stepped portions 84 and 85 respectively. The stepped portions 84 and 85 are respectively capable of receiving a pair of arm portions 61 and 62 which are provided on and projected backwardly from the two side portions of the header 6. The header 6 is energized backwardly by a pair of compression coil springs 8 which are respectively interposed between the support member 7 and the header 6. When the arm portions 61 and 62 are contacted with the stepped portions 84 and 85, the backward sliding motion of the header 6 can be restricted.

On the respective lower surfaces of the arm portions 24 and 25, there are mounted locking engagement pieces 9 respectively. These locking engagement pieces 9 are elastic members which are made by deforming iron wires; and, each of them includes a mounting portion 91 which is bent almost 180°, and an engagement portion 92 extending forwardly from the mounting portion 91 and having a leading end portion 92A bent toward the side surfaces 6a, 6b of the header 6. The mounting portions 91 of the locking engagement pieces 9 are respectively fitted into bosses 83 which are respectively provided on and projected from the neighboring portions of the leading ends of the lower surfaces of the arm portions 24 and 25. The engagement portions 92 of the locking engagement pieces 9 can be respectively stored into engagement stepped portions 88 and 89 which are respectively formed on the lower surfaces of the side rods 26 and 27. In the case of the engagement pieces 9, in a state where they are mounted on the lower surfaces of the arm portions 24 and 25, the engagement portions 92 of the engagement pieces 9 generate spring forces in directions to go toward the side surfaces 6a and 6b of the header 6, so that the leading end portions 92A of the engagement portions 92 are elastically energized respectively in the directions to go toward the side surfaces 6a and 6b of the header 6.

Figure 5A:
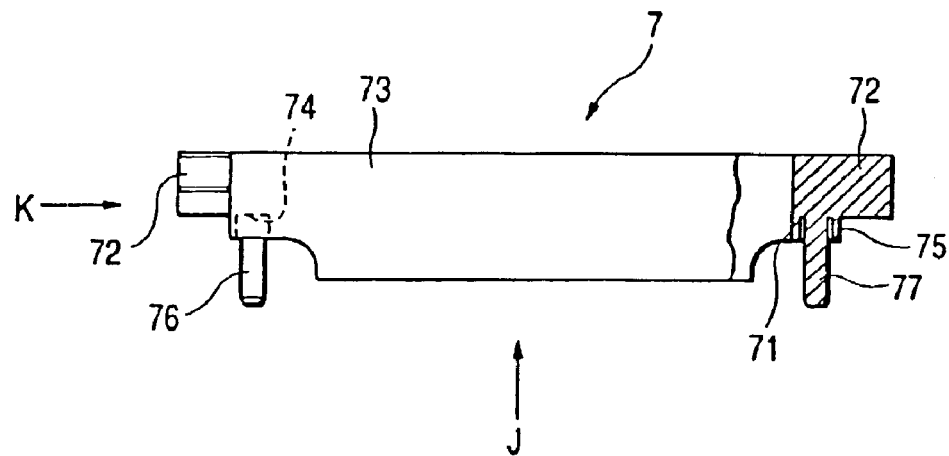
FIGS. 5(a) to 5(c) are explanatory views of the structure of a support member: specifically.
Figure 5B:
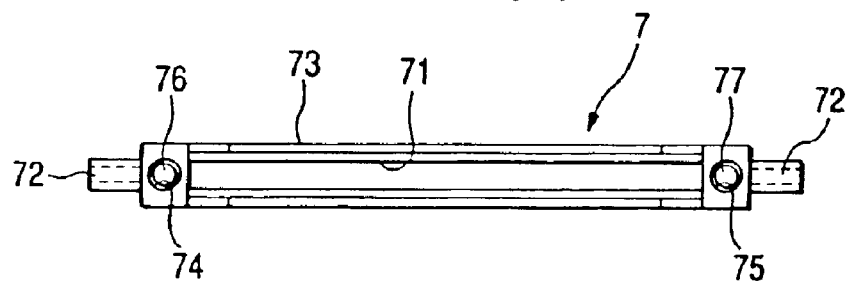
Figure 5C:
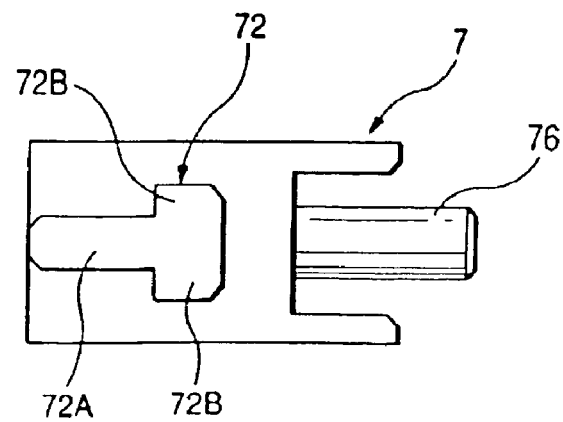
Figure 6A:
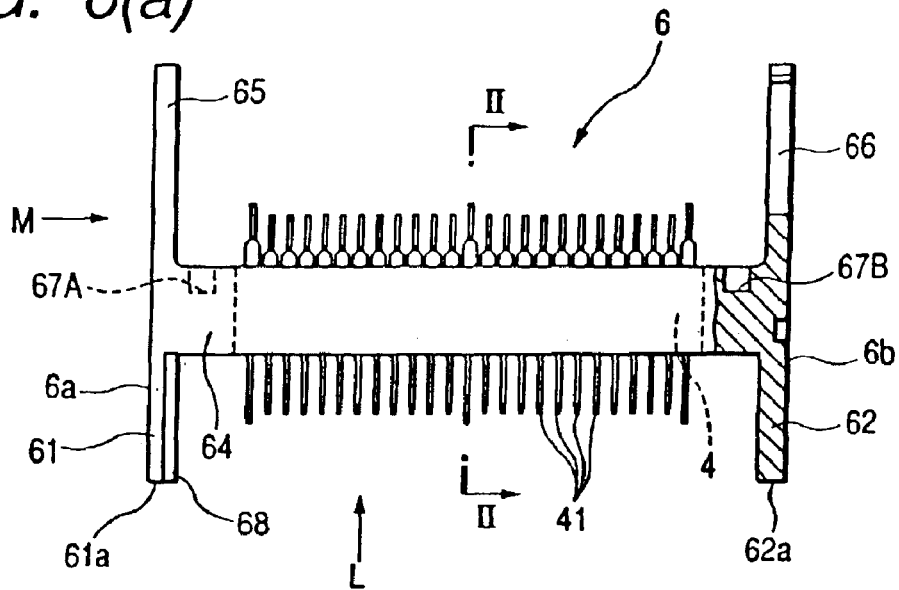
FIGS. 6(a) to 6(d) are explanatory views of the structure of a header: specifically.
Figure 6B:
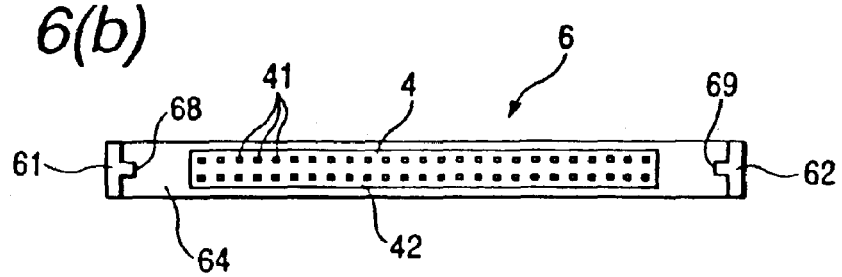
Figure 6C:
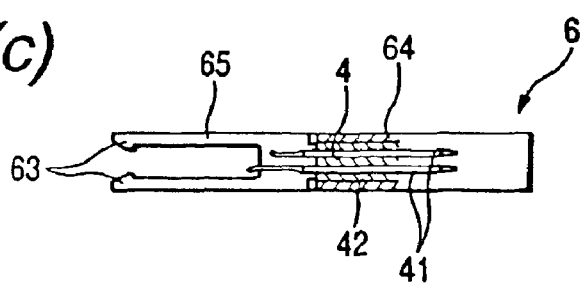
Figure 6D:
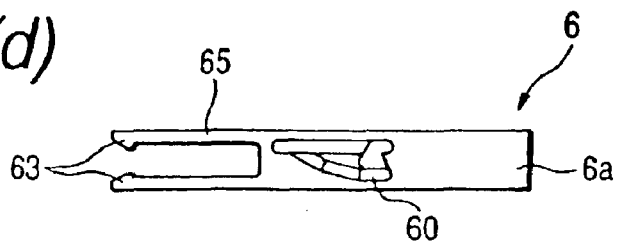

FIGS. 5(a), 5(b), and 5(c) are explanatory views of the structure of the support member 7. Specifically, FIG. 5(a) is a bottom view thereof, FIG. 5(b) is a view thereof taken from the direction of an arrow J shown in FIG. 5(a), and FIG. 5(c) is a side view thereof taken from the direction of an arrow K shown in FIG. 5(a).

The support member 7 includes a main body portion 73 which extends in the transverse direction of the support member 7. In the main body portion 73, there is formed a through hole 71 which penetrates through the main body portion 73 along the longitudinal direction thereof. On the two ends of the main body portion 73, there are respectively provided engagement projections 72 integrally therewith. As shown in FIG. 5(c), each of the engagement projections 72 includes a main body portion 72A extending in the longitudinal direction of the engagement projection 72, and a pair of projecting portions 72B which respectively project in the upper and lower directions from the rear end portion of the main body portion 72A. The engagement projections 72 can be respectively mounted onto the mounting stepped portions 82 of the side rods 26 and 27 in a 25 state where the pair of projecting portions 72B are respectively engaged with slide guide portions 65 and 66 formed in the two side portions of the header 6.

In the neighboring portions of the two ends of the main body portion 73 of the support member 7, on the side thereof facing the header 6, there are formed a pair of spring mounting recesses 74 and 75 which are used to mount a coiled spring 8. From the bottom portions of the two spring mounting recesses 74 and 75, there are respectively projected spring holding projections 76 and 77 which project toward the header 6 and are used to hold the coiled spring 8.

FIGS. 6(*a*) to 6(*d*) are explanatory views of the structure of the header 6. Specifically, FIG. 6(*a*) is a bottom view thereof, FIG. 6(*b*) is a view thereof taken from the direction of an arrow L shown in FIG. 6(*a*), FIG. 6(*c*) is a section view thereof taken along the line II—II shown in FIG. 6(*a*), and FIG. 6(*d*) is a view taken from the direction of an arrow M shown in FIG. 6(*a*).

The header 6 includes a main body portion 64 which extends in the transverse direction of the header 6. Into the main body portion 64, there is fitted the main body portion 42 of the second connector 4; and, due to this, the second connector 4 and header 6 can be handled as an integrated part.

On the two side portions of the main body portion 64, there are formed not only two slide guide portions 65 and 66 formed so as to extend forwardly but also a pair of arm portions 61 and 62 which respectively project from the two side portions of the main body portion 64 in the opposite directions to the slide guide portions 65 and 66.

As shown in FIG. 6(*b*), on the inner surfaces of the pair of arm portions 61 and 62, there are disposed rails 68 and 69 which respectively extend from the root portions of the arm portions 61 and 62 up to the leading ends 61*a* and 62*a* thereof. These rails 68 and 69 respectively consist of keys which can be freely engaged into their associated key grooves 103 (see FIG. 1) respectively formed in the two side portions of the CF card 100. The rails 68 and 69 guide the insertion and removal of the CF card 100 and also prevent the CF card 100 from being mounted into the card connecting adapter 1 in such a manner that it is turned upside down or front-side back.

With reference to FIG. 6(*c*), each of the slide guide portions 65 and 66 is formed such that, when it is viewed from the side surface thereof, it has a U shape which is open toward the support member 7; and, the slide guide portions 65 and 66 can be slidably engaged with the engagement projections 72 of the support member 7. On the respective front end portions of the slide guide portions 65 and 66, there are provided removal-preventive projections 63 which can be respectively engaged with the projecting portions 72B of the engagement projections 72 to thereby prevent the engagement projections 72 against removal.

As shown in FIG. 6(*a*), at the positions of the main body portion 64 that face the support member 7, that is, at the positions of the main body 64 that correspond to the spring mounting recesses 74 and 75 of the support member 7, there are formed a pair of spring mounting recesses 67A and 67B which are used to mount the coiled spring 8.

With reference to FIG. 6(*d*), in the two side surfaces 6*a* and 6*b* (in FIG. 6(*d*), only the side surface 6*a* is shown), there are respectively formed substantially ring-shaped grooves 60 (triangular-ring-shaped). Into these ring-shaped grooves 60, there can be engaged the leading end portions 92A of the engagement portions 92 of the locking engagement pieces 9 which are respectively energized toward the side surfaces 6*a* and 6*b* of the header 6.

FIGS. 7(*a*) to 7(*d*) are views to explain the shape of the ring-shaped groove 60. Specifically, FIG. 7(*a*) is an enlarged view of the ring-shaped groove 60, FIG. 7(*b*) is a section view taken along the line III—III shown in FIG. 7(*a*), FIG. 7(*c*) is a section view taken along the line IV—IV shown in FIGS. 7(*a*), and 7(*d*) is a section view taken along the line V—V shown in FIG. 7(*a*).

The ring-shaped groove 60 includes a first passage 60A, a second passage 60B, a third passage 60C, a fourth passage 60D and a fifth passage 60E. With reference to FIGS. 7(*a*) and 7(*b*), the first passage 60A extends in the back-and-forth direction of the ring-shaped groove 60, while the width of the first passage 60A is set substantially equal to the diameter of the leading end portion 92A of the locking engagement piece 9. The bottom portion of the first passage 60A provides a flat surface having a depth Da and is set higher than the bottom portion of the second passage 60B which provides a flat surface having a depth Db. The first passage 60A is connected to the second passage 60B through a stepped portion 60F. This stepped portion 60F provides an inclined surface which is able to guide the leading end portion 92A of the locking engagement portion 9 downwardly as it goes forwardly.

Referring to FIGS. 7(*a*) and 7(*c*), the second passage 60B, when it is viewed from the side surface side thereof, is open backwardly substantially in a dogleg shape; and, the second passage 60B includes a bent wall 60G formed so as to be continuous with the stepped portion 60F, and a restrict wall 60J formed so as to be opposed to the bent wall 60G. This restrict wall 60J provides an inclined surface which guides the leading end portion 92A of the locking engagement piece 9 downwardly as it goes backwardly. The width of the second passage 60B in the back-and-forth direction thereof is set larger than (for example, about twice) the diameter of the leading end portion 92A of the locking engagement piece 9. The second passage 60B is connected to the third passage 60C through a stepped portion 60H.

Referring to FIGS. 7(*a*) and 7(*d*), the third passage 60C includes a bottom portion which provides a flat surface having a depth Dc, and the third passage 60C is connected to the fourth passage 60D having an inclined surface formed so as to be continuous with the flat surface of the third passage 60C. The fourth passage 60D is connected to the fifth passage 60E having a bottom portion which is situated higher than the bottom portion of the third passage 60C and has a depth Dd. The fifth passage 60E is connected to the first passage 60A through a stepped portion 60I. The widths of the third, fourth and fifth passages 60C, 60D and 60E are respectively set substantially equal to the diameter of the leading end portion 92A of the locking engagement piece 9.

Figure 8A:
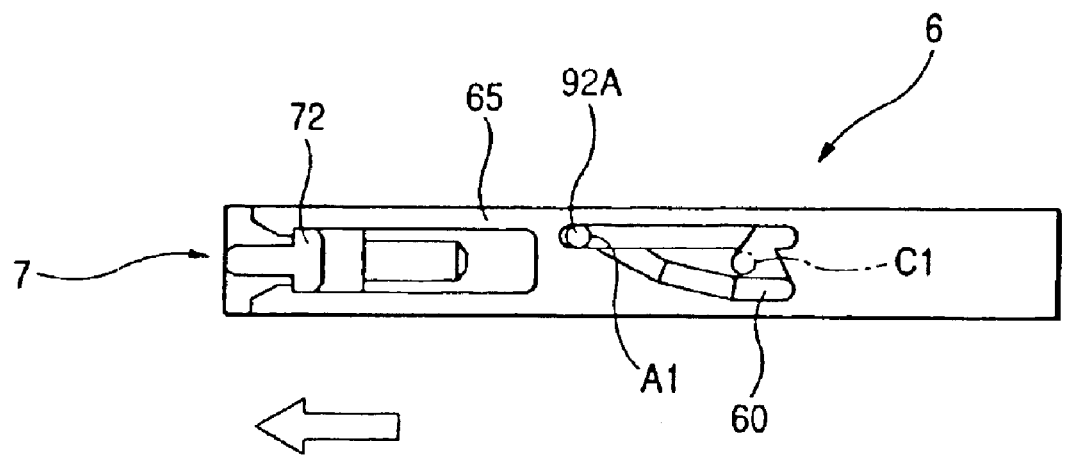
FIGS. 8(a) to 8(b) are explanatory views of the sliding motion of the header: specifically.
Figure 8B:
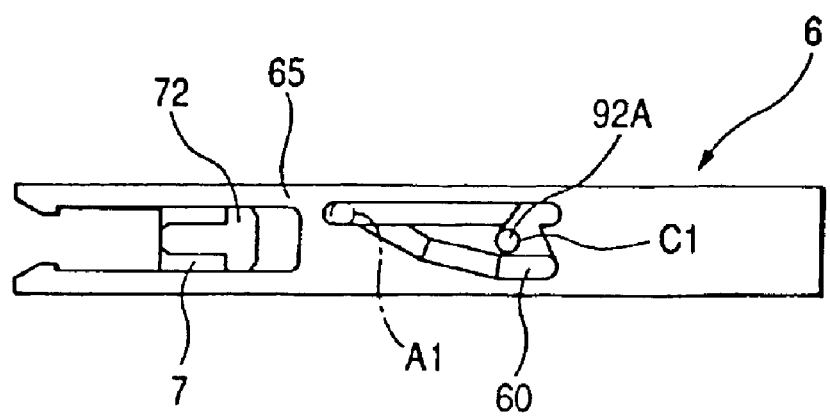

Now, FIG. 8 is a view to explain how the header 6 slides. Specifically, FIG. 8(*a*) shows a state of the header 6 where it is set at a first position, and FIG. 8(*b*) shows a state of the header 6 where it is set at a second position.

Referring to FIGS. 7 and 8, when the header 6 is set at the first position, the leading end portion 92A of the locking engagement piece 9 is present at a position A1; and, when the header 6 is slid forwardly and is set at the second position, the leading end portion 92A of the locking engagement piece 9 is present at a position C1. The header 6 is slid from the first position to the second position against the spring force of the coiled spring 8, so that the header 6 is locked at the second position. When an external force going forward is applied to the header 6 locked at the second position, the locked state of the header 6 at the second position is released and, due to the spring force of the coiled spring 8, the header 6 is then slid from the second position to the first position. When the header 6 is slid from the first position to the second position and is slid back to the first position again, the leading end portion 92A of the locking engagement piece 9 is shifted in such a manner that it goes around within the ring-shaped groove 60.

Specifically, when an external force going forward is applied to the header 6 set at the first position to thereby slide the header 6 against the spring force of the coiled spring 8, the leading end portion 92A of the locking engagement piece 9 is shifted through the first passage 60A up to the position B1 of the second passage 60B.

When the external force applied to the header 6 is released therefrom, the energizing force of the coiled spring 8, that is, a backward force is applied to the header 6, so that the header 6 is slid backward. The leading end portion 92A of the locking engagement piece 9 is prevented by the stepped portion 60F from returning to the first passage 60A and it is guided downward from the stepped portion 60F, so that the leading end portion 92A is engaged with the bent wall 60G at a position C1. The position C1 is a neutral position which the leading end portion 92A takes in its free state where no external force is applied to the locking engagement piece 9 having a spring force.

When a forward external force is applied to the header 6 again and the header 6 is thereby slid against the spring force of the coiled spring 8, the leading end portion 92A in engagement with the bent wall 60G at the position C1 is shifted backwardly with respect to the header 6. The backward shifted leading end portion 92A is engaged with the restrict wall 60J at a position D1; and, the leading end portion 92A is guided downward by the restrict wall 60J and is thereby shifted up to the position E1 of the third passage 60C. At the position E1, the stepped portion 60H prevents the leading end portion 92A from moving back to the second passage 60B.

When the external force applied to the header 6 is removed therefrom, the header 6 is slid backward due to the energizing force of the coiled spring 8. Due to the sliding motion of the header 6, the leading end portion 92A present at the position E1 of the third passage 60C is moved beyond the fourth passage 60D consisting of an inclined surface, is guided to the fifth passage 60E, and is shifted up to the position A1 of the first passage 60A. At the position A1, the stepped portion 60I prevents the leading end portion 92A from moving back to the fifth passage 60E.

Now, FIGS. 9, 10, 11 and 12 are respectively bottom views of the card connecting adapter 1, showing a plurality of states which the card connecting adapter 1 can show. However, in FIGS. 9 to 12, there is shown the structure of the card connecting adapter 1 with the first and second metal covers 22 and 23 removed therefrom.

Figure 9:
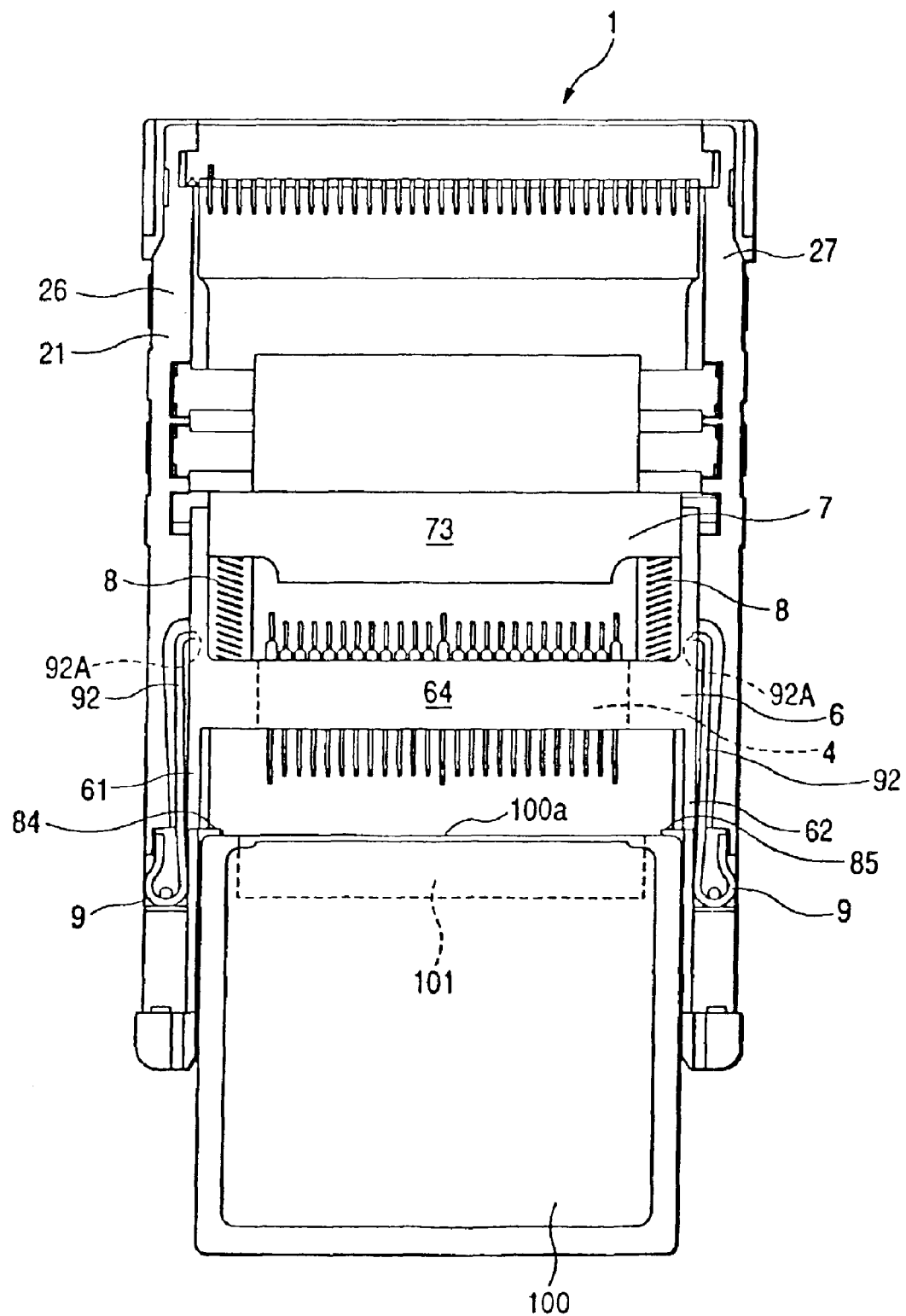
FIG. 9 is a bottom view of a card connecting adapter according to the first embodiment of the invention, showing a process for mounting a CF card with an antenna into a PC card slot formed in the card connecting adapter.

FIG. 9 shows the state of a mounting process of the CF card 100 with an antenna.

Figure 10:
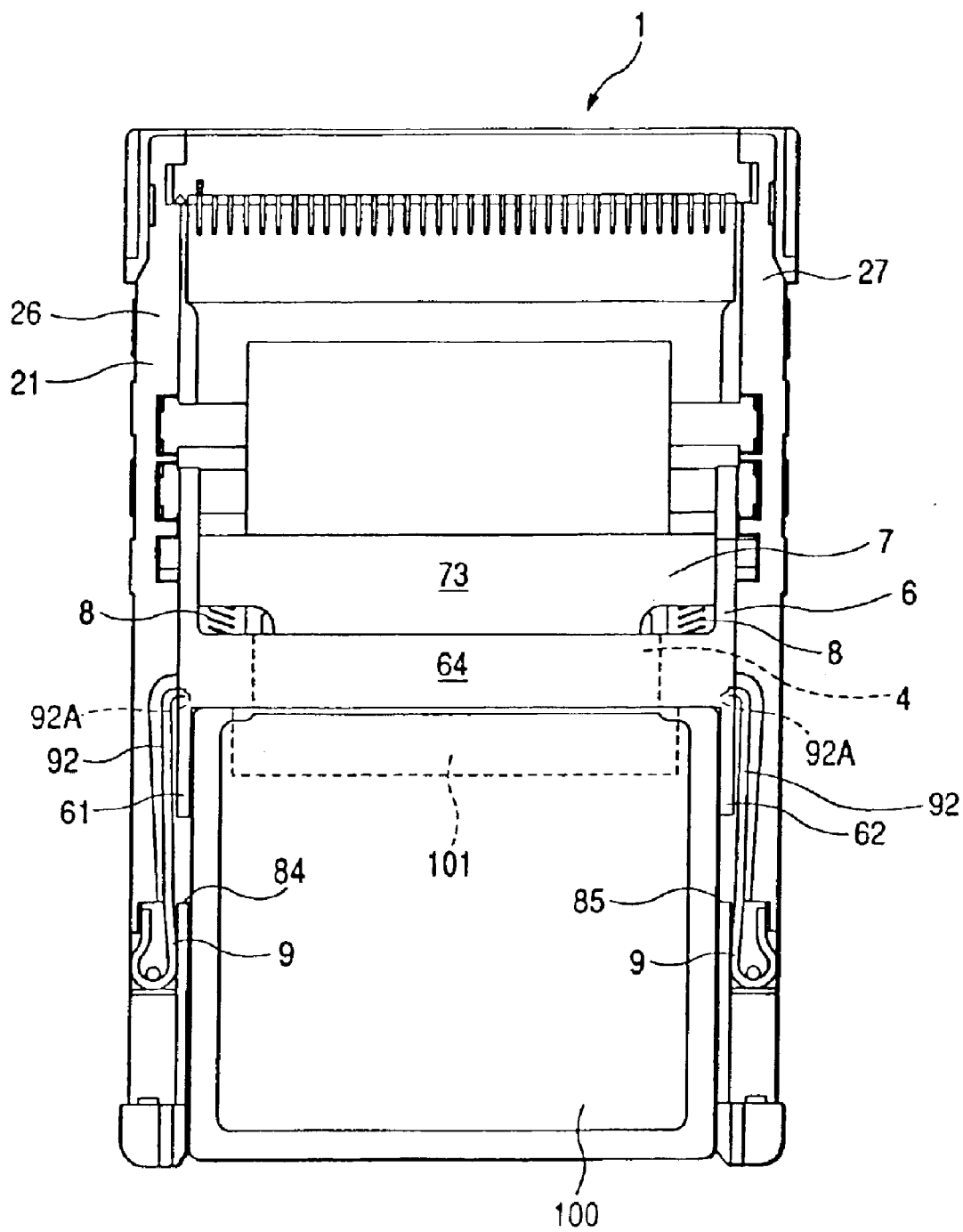
FIG. 10 is a bottom view of the card connecting adapter shown in FIG. 9, showing a state in which the CF card with an antenna is completely inserted into the PC card slot of the card connecting adapter.

After the front end face 100a of the CF card 100 is contacted with the header 6, the header 6 is pushed forward by the front end face 100a of the CF card 100. Due to this, the header 6 is slid forward against the energizing force of the coiled spring 8. The sliding motion of the header 6, as shown in FIG. 10, is restricted by the main body portion 73 of the support member 7 and, after then, when a forward force is further applied to the CF card 100, the connecting pins 41 of the second connector and the connecting pins of the connector 101 can be fitted with each other. In this manner, the CF card 100 can be connected to the card connecting adapter 1 electrically and mechanically and can be held by the header 6 and right and left arm portions 24 and 25.

For example, assuming that the header 6 is present at the first position before the CF card 100 with an antenna is mounted, after the CF card 100 is pushed forward, the restitutive force of the coiled spring 8 is actuated to thereby shift the header 6 backward. At this time, with reference to FIG. 7(a), the leading end portion 92A of the locking engagement piece 9 present at the position B1 is guided to the position C1 by the stepped portion 60F and is engaged with the bent wall 60G at the position C1. As a result of this, the header 6 can be locked at the second position (see FIG. 11).

In this state, when the card connecting adapter 1 is mounted into the PC card slot 201 and is connected mechanically and electrically, the CF card 100 with an antenna can be connected to the PC card slot 201 mechanically and electrically through the card connecting adapter 1.

When the antenna mounting surface 100b of the CF card 100 with an antenna held by the header 6 is pushed forward, the main body portion 64 of the header 6, as shown in FIG. 10, is contacted again with the main body portion 73 of the support member 7, thereby restricting further insertion of the CF card 100.

Figure 7A:
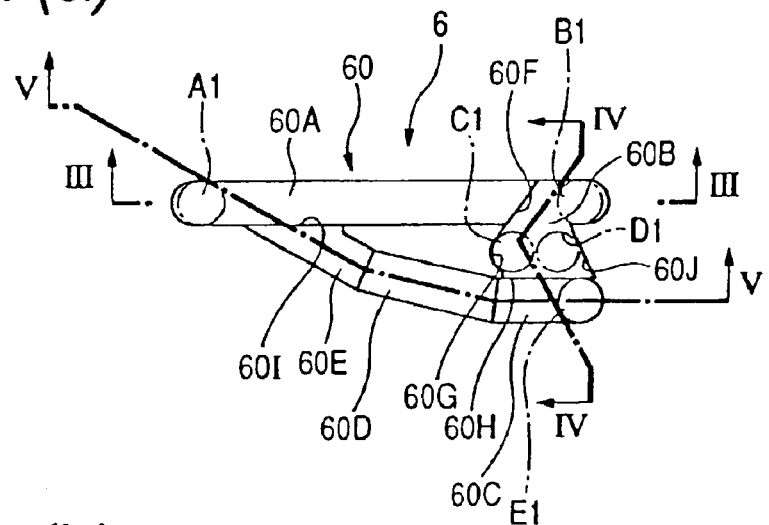
FIGS. 7(a) to 7(d) are explanatory views of the structure of a ring-shaped groove: specifically.
Figure 7B:
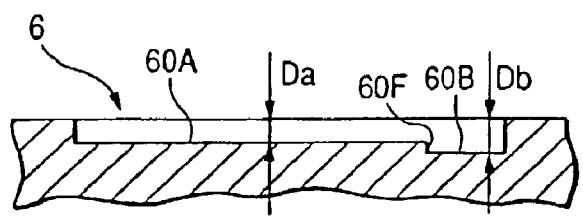
Figure 7C:
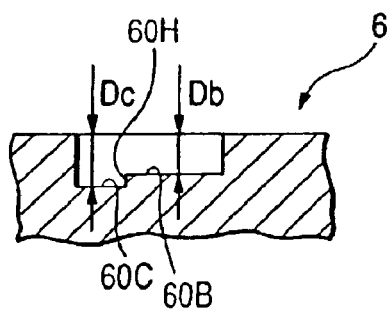
Figure 7D:
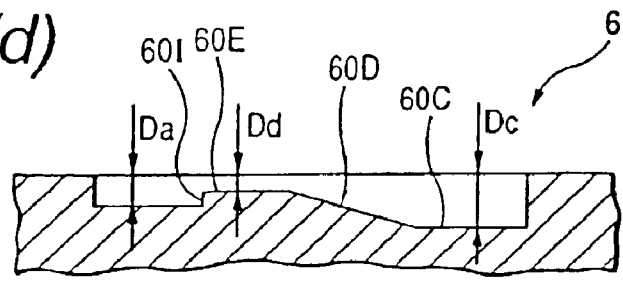
Figure 12:
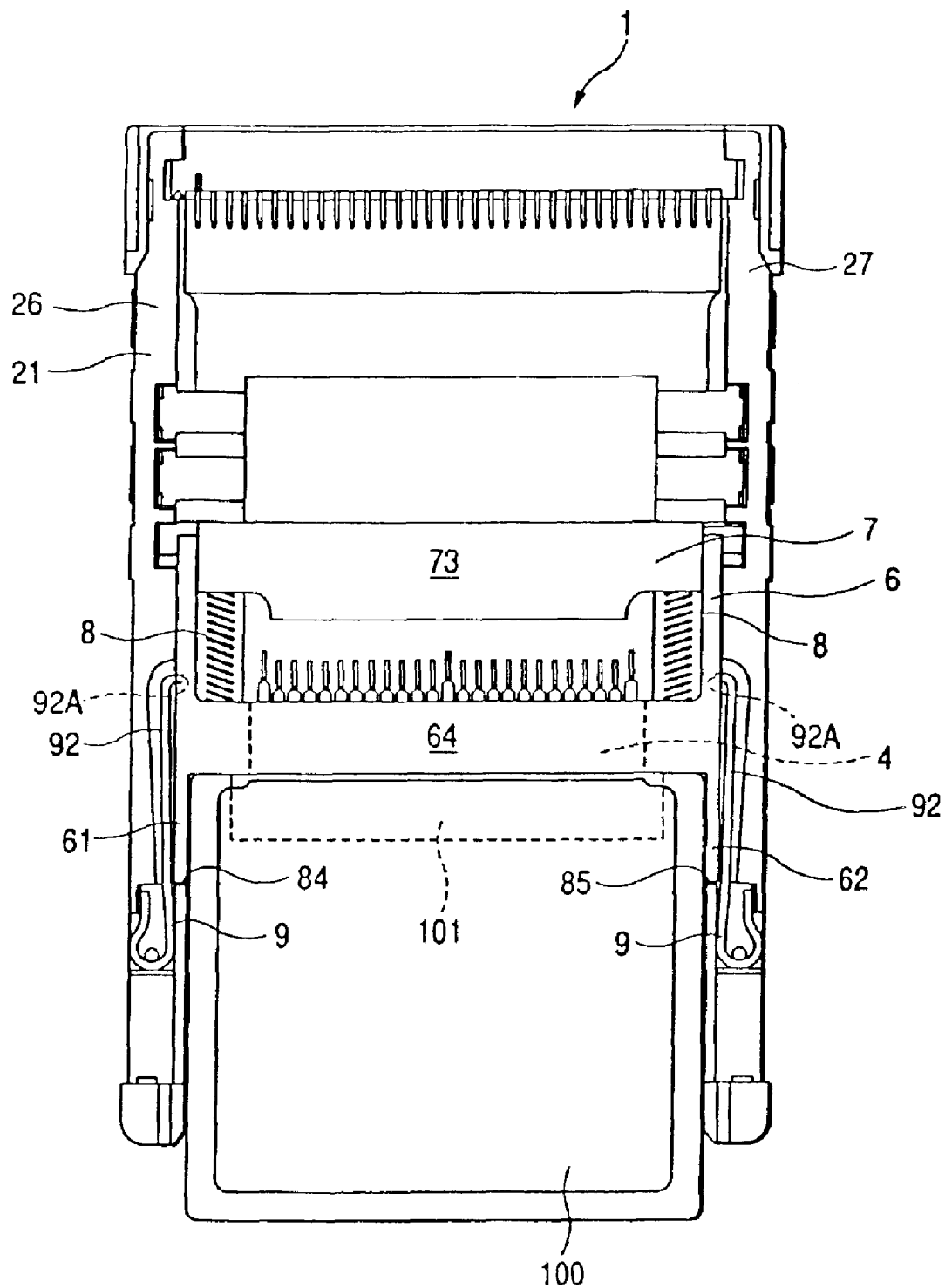
FIG. 12 is a bottom view of the above card connecting adapter, showing a state in which the CF card with an antenna is held at its projected-out position, that is, it is set at a first position; and, FIG. 13 is a view of the structure of a PC card with an antenna according to a second embodiment of the invention.

In this case, with reference to FIG. 7(a), the leading end portion 92A of the locking engagement piece 9 in engagement with the bent wall 60G at the position C1 is shifted to the position E1 of the third passage 60C, so that the locked state of the header 6 at the second position is released. When the locked state of the header 6 is released, the header 6 is slid backward up to the first position due to the restitutive force of the coiled spring 8. With the sliding motion of the header 6, the CF card 100 mounted into the second connector 4 is also slid backward and, as shown in FIG. 12, the antenna mounting surface 100b of the CF card 100 with an antenna is projected by a given amount (about 6 mm) from the rear end 2b of the housing 2. Due to this, the antenna 102 can be projected out from the PC card slot 201 of the notebook personal computer 200.

Figure 11:
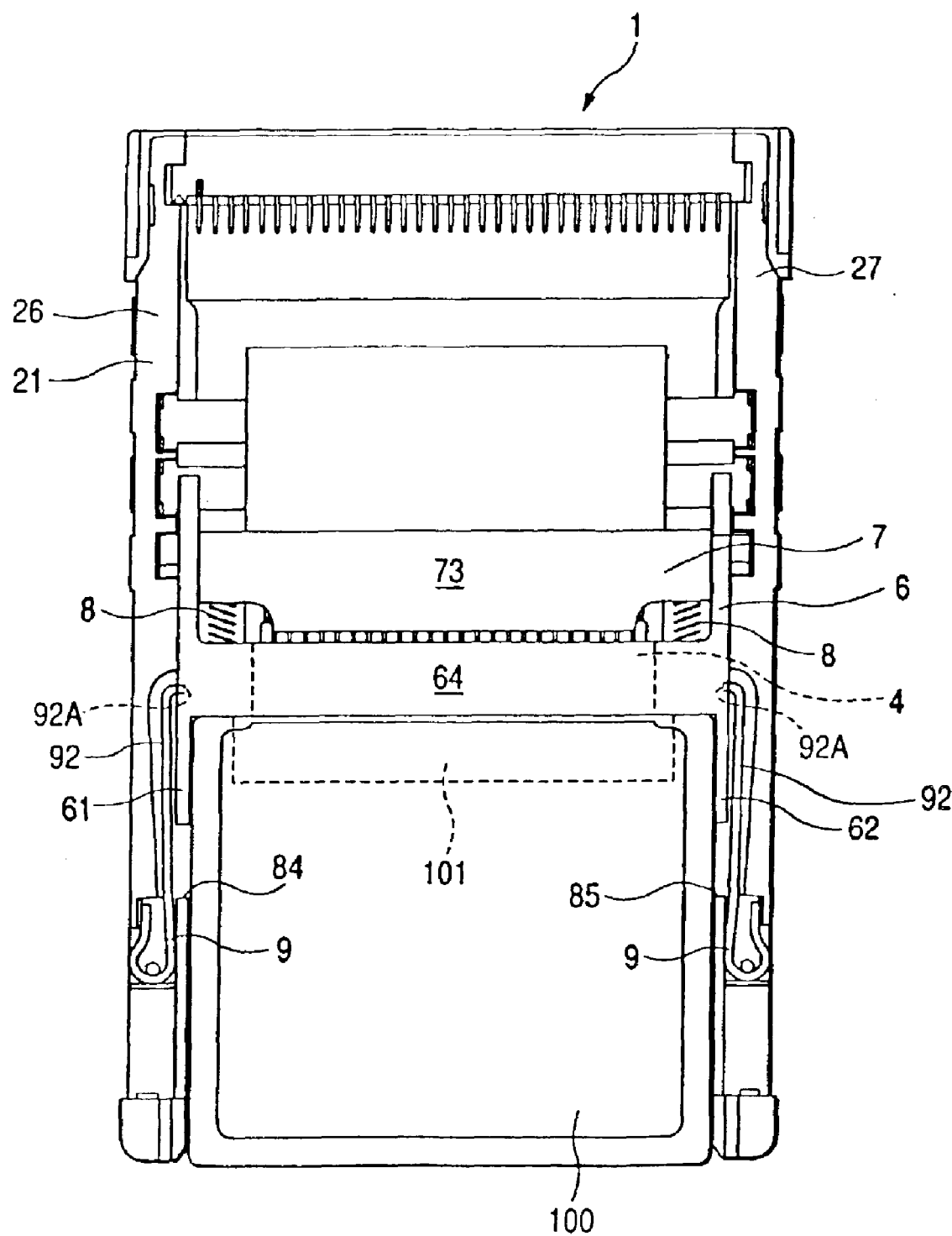
FIG. 11 is a bottom view of the above card connecting adapter, showing a state in which the CF card with an antenna is held at its pushed-in position, that is, it is locked at a second position.

Also, in this state, when the antenna mounting surface 100b of the CF card 100 projected by the given amount from the PC card slot 201 is pushed forward with a finger, the header 6 is shifted from the first position to the second position and thus the CF card 100 with an antenna can be set again in a state shown in FIG. 11.

As described above, according to the present embodiment, in a state where the CF card 100 with an antenna is inserted into the PC card slot 201, by pushing the antenna mounting surface 100b of the CF card 100 with an antenna, the antenna mounting surface 100b can be switched between the following two states: that is, one state in which the antenna mounting surface 100b is projected backwardly of the rear end edge 2b of the housing 2, and the other state in which the antenna mounting surface 100b is substantially superimposed on the rear end edge 2b of the housing 2.

Also, when radio communication is not in execution, or when a communication state is good while the CF card 100 with an antenna is mounted into the PC card slot 201, since the projected antenna mounting surface 100b of the CF card 100 with an antenna provides an obstacle, it is possible to keep the antenna mounting surface 100b in a non-projected state.

Further, simply by pushing the antenna mounting surface 100b of the CF card 100 with an antenna, not only the locked state and locking-released state of the header 6 can be switched over to each other but also the projected state and non-projected state of the antenna mounting surface 100b of the CF card 100 with an antenna can be switched with one touch.

Although description has been given heretofore of the first embodiment according to the invention, the invention can also be enforced in other embodiments. For example, in the above embodiment, description has been given of a card connecting adapter which is used to adapt a CF card with an antenna of Type I to a PC card slot; however, the invention can also be applied to a card connecting adapter which is used to adapt a card meeting with a certain specification to other different specification.

Also, the invention can apply not only to a card connecting adapter but also to a card with an antenna.

Figure 13:
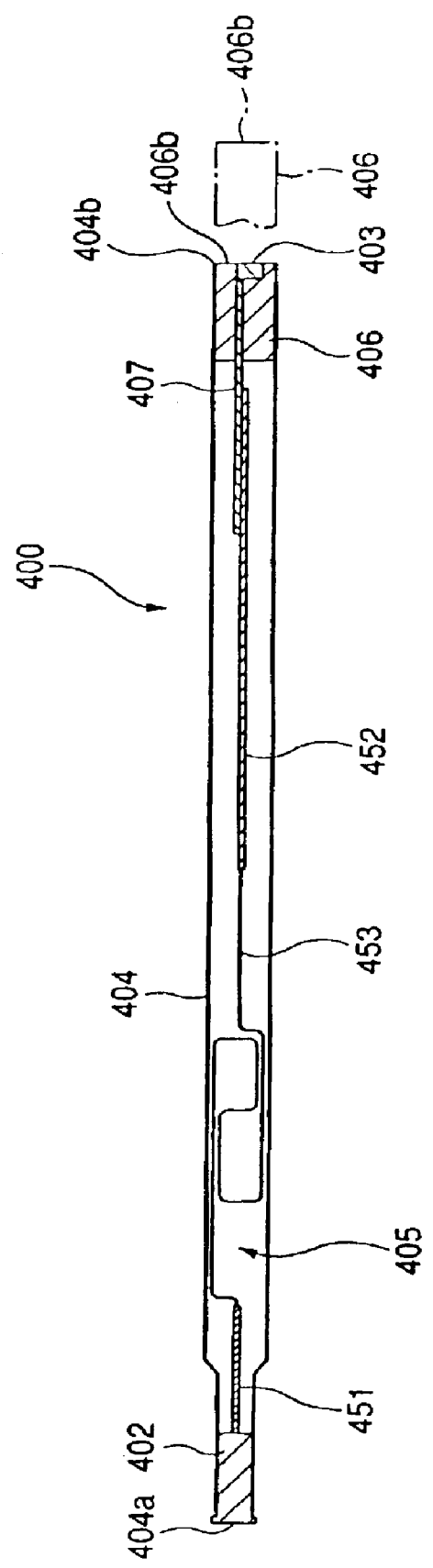

Now, FIG. 13 is a section view of the structure of a PC card with an antenna according to a second embodiment of the invention. Referring here to FIG. 13, a PC card with an antenna 400 is a card which meets the standard of Type II; and, this PC card with an antenna 400 includes a housing 404 the interior space of which is divided into several sections. Specifically, on the front end face 404a of the housing 400, there is disposed a connector (connecting portion) 402 which is mounted into the connector 202 provided in the PC card slot 201 of the notebook personal computer 200 and is contact connected thereto. Also, on the rear end face of the PC card with an antenna 400, there is disposed a long antenna 403.

In the vicinity of the rear end of the housing 404, there is disposed an antenna hold member 406 which can be slidably shifted, and the rear end face of the antenna hold member 406 provides an antenna mounting surface 406b on which the antenna 403 is mounted. The antenna hold member 406 can be slid between first and second positions and can be locked at the second positions. Specifically, the first position is a position where the antenna 403 projects by a given amount backwardly of the rear end 404b of the housing 404 (in FIG. 13, a position shown by a one-dot chained line); and, the second position is a position where the antenna 403 is superimposed on the rear end 404b of the housing 404 (in FIG. 13, a position shown by a solid line).

Referring to a mechanism which slides and shifts the antenna hold member 406, locks the antenna hold member 406, and releases the locked state thereof, there may be employed a similar structure to the mechanism employed for the header 6 in the previously described first embodiment.

Within the housing 404, there is stored a wiring body 405. Specifically, the wiring body 405 comprises a first printed-circuit board 451 which has a wiring pattern formed thereon and is electrically connected to the connector 402, a second printed-circuit 452 having a wiring pattern formed thereon, and a flexible printed wiring cable 453 which connects the first and second printed-circuit boards 451 and 452 to each other electrically. A plurality of connecting pins, which are disposed in parallel to the connector 402, are connected to the wiring pattern formed on the first printed-circuit 451.

Also, electrical connection between the antenna 403 and second printed-circuit board 452 is achieved by a connecting piece 407 which extends forwardly of the antenna 403. Specifically, the connecting piece 407 is guided through the antenna hold member 406 into the interior portion of the housing 404, while the leading end portion of the connecting piece 407 is electrically connected to the second printed-circuit board 452.

When the antenna mounting surface 406b of the antenna hold member 406 at the second position is pushed forward with a finger, the antenna hold member 406 is slid from the second position to the first position. Also, in this state, when the antenna mounting surface 406b of the CF card with an antenna 400, projects from the PC card slot 201 by a given amount, is pushed forward with a finger, the antenna hold member 406 is slid from the second position to the first position.

Due to the sliding or shifting motion of the antenna hold member 406, the antenna 403 is slid or shifted in a direction in which it approaches and parts away from the connector 402; however, the flexible printed wiring cable 453 is deformed as the antenna 403 is slid, thereby being able to maintain the electrical connection between the antenna 403 and connector 402.

In case where the antenna hold member 406 is set at the second position, the antenna 403 can be projected from the PC card slot 201 of the notebook personal computer 200.

In the present embodiment, the antenna 403 can be switched between two states: that is, in one of them, the antenna 403 is projected backwardly of the rear end 404b of the housing 404; and, in the other, the antenna 403 is superimposed on the rear end 404b of the housing 404.

Owing to this, when radio data communication is to be executed between the present notebook personal computer with the PC card with the antenna 403 mounted therein and another notebook personal computer or portable information equipment, the antenna 403 can be kept in a good communication condition. Also, when radio data communication is not carried out, or when a good communication condition can be obtained in a state where the PC card with the antenna 403 is mounted into the PC card slot 201, the antenna hold member 406 in the projected state provides an obstacle; however, in this case, according to the present embodiment, the antenna 403 can be kept from projecting from the rear end 404b of the housing 404.

The present invention can be enforced in still another embodiment as well. For example, although in the above-mentioned embodiment, description has been given of a case in which a PC card with an antenna of Type II is adapted to a PC card slot, the invention can also apply to other arbitrary cards meeting different specifications.

Moreover, there are also possible various design changes without departing from the scope of the following claims.

What is claimed is:

1. An IC card with an antenna, comprising:

a card-shaped housing;

a connecting portion mounted onto said housing and connected into a card slot;

an antenna holding member holding an antenna and shiftably mounted on said housing in such a manner that the antenna held by said antenna holding member is configured to be shifted between a first position where a portion of said IC card is projected outwardly of said housing and a second position where the portion of said IC card is retreated from said first position toward an interior portion of said housing;

a first printed-circuit board electrically connected to said connecting portion;

a second printed-circuit board; and a flexible printed wiring cable which connects said first printed-circuit board and said second printed-circuit board to each other electrically.

2. The IC card according to claim 1, further comprising:

a connected piece guided through said antenna holding member into the interior portion of said housing, wherein a leading end portion of said connecting piece is electrically connected to said second printed-circuit board.

* * * * *